US008319286B2

(12) United States Patent
Su et al.

(10) Patent No.: US 8,319,286 B2
(45) Date of Patent: Nov. 27, 2012

(54) SYSTEM AND METHOD FOR INPUT PIN ESD PROTECTION WITH FLOATING AND/OR BIASED POLYSILICON REGIONS

(75) Inventors: Ting Chieh Su, Nantou (TW); Min Chie Jeng, Keelung (TW); Chin Chang Liao, Shanghai (CN); Jun Cheng Huang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 12/979,306

(22) Filed: Dec. 27, 2010

(65) Prior Publication Data
US 2012/0001261 A1    Jan. 5, 2012

(30) Foreign Application Priority Data

Dec. 29, 2009   (CN) .......................... 2009 1 0247495

(51) Int. Cl.
*H01L 23/60* (2006.01)
*H01L 27/07* (2006.01)
(52) U.S. Cl. ................ 257/355; 257/173; 257/E21.632; 257/E23.002; 257/E27.021; 257/E29.255; 361/54; 361/56; 361/91.1; 361/111; 361/118
(58) Field of Classification Search .................. 257/173, 257/345, 355, 359, 360, 365, 366, 377, 391, 257/392, 409, 577, E21.632, E23.002, E23.141, 257/E27.021, E29.181, E29.255; 361/54, 361/56, 91.1, 111, 118
See application file for complete search history.

(56) References Cited

U.S. PATENT DOCUMENTS

| 4,148,047 A | 4/1979 | Hendrickson |
| 4,184,047 A | 1/1980 | Langford |
| 5,034,785 A | 7/1991 | Blanchard |
| 5,164,806 A | 11/1992 | Nagatomo et al. |
| 5,517,049 A | 5/1996 | Huang |
| 5,959,488 A | 9/1999 | Lin et al. |

(Continued)

FOREIGN PATENT DOCUMENTS

CN    1360347 A    7/2002

OTHER PUBLICATIONS

Final Office Action for U.S. Appl. No. 12/623,363, mailed on Jan. 5, 2011, 8 pages.

(Continued)

*Primary Examiner* — Hsien Ming Lee
*Assistant Examiner* — Walter H Swanson
(74) *Attorney, Agent, or Firm* — Kilpatrick Townsend & Stockton LLP (57) ABSTRACT

A system and method for electrostatic discharge protection. The system includes a first transistor including a first drain, a second transistor including a second drain, and a resistor including a first terminal and a second terminal. The first terminal is coupled to the first drain and the second drain. Additionally, the system includes a third transistor coupled to the second terminal and a protected system. The third transistor includes a first gate, a first dielectric layer located between the first gate and a first substrate, a first source, and a third drain. The protected system includes a fourth transistor, and the fourth transistor includes a second gate, a second dielectric layer located between the second gate and a second substrate, a second source, and a fourth drain.

10 Claims, 10 Drawing Sheets

U.S. PATENT DOCUMENTS

| | | | |
|---|---|---|---|
| 6,639,283 B1 * | 10/2003 | Hung et al. | 257/355 |
| 6,690,067 B2 | 2/2004 | Ker et al. | |
| 7,078,775 B2 | 7/2006 | Yi et al. | |
| 7,265,041 B2 | 9/2007 | Wu et al. | |
| 7,642,602 B2 | 1/2010 | Su et al. | |
| 2002/0076402 A1 | 6/2002 | Lin et al. | |
| 2002/0149059 A1 | 10/2002 | Ker et al. | |
| 2003/0210359 A1 | 11/2003 | Lee et al. | |
| 2004/0007742 A1 | 1/2004 | Cheng et al. | |

OTHER PUBLICATIONS

Final Office Action for U.S. Appl. No. 11/517,546, mailed on Oct. 20, 2010, 7 pages.

Final Office Action for U.S. Appl. No. 11/517,546, mailed on Jan. 11, 2010, 8 pages.

Non-Final Office Action for U.S. Appl. No. 11/517,546, mailed on Apr. 22, 2011, 10 pages.

Non-Final Office Action for U.S. Appl. No. 12/623,363, mailed on Jul. 22, 2010, 8 pages.

Non-Final Office Action for U.S. Appl. No. 11/517,546, mailed on Jun. 23, 2010, 7 pages.

Non-Final Office Action for U.S. Appl. No. 11/517,546, mailed on Jul. 30, 2009, 8 pages.

Requirement for Restriction/Election for U.S. Appl. No. 12/623,363, mailed on Jun. 9, 2010, 7 pages.

Requirement for Restriction/Election for U.S. Appl. No. 11/517,546, mailed on Apr. 2, 2009, 5 pages.

Final Office Action for U.S. Appl. No. 12/623,363, mailed on Jan. 23, 2012, 8 pages.

Final Office Action for U.S. Appl. No. 11/517,546, mailed on Nov. 3, 2011, 12 pages.

Non-Final Office Action for U.S. Appl. No. 12/623,363, mailed on Jul. 21, 2011, 9 pages.

Notice of Allowance for U.S. Appl. No. 11/550,529, mailed on Aug. 20, 2009, 7 pages.

Non-Final Office Action for U.S. Appl. No. 11/550,529, mailed on Feb. 23, 2009, 8 pages.

Requirement for Restriction/Election for U.S. Appl. No. 11/550,529, mailed on Dec. 15, 2008, 7 pages.

Non-Final Office Action for U.S. Appl. No. 11/517,546, mailed on May 17, 2012, 10 pages.

Notice of Allowance for U.S. Appl. No. 12/623,363, mailed on May 17, 2012, 9 pages.

Final Office Action for U.S. Appl. No. 11/517,546, mailed on Aug. 10, 2012, 8 pages.

* cited by examiner

SYSTEM AND METHOD FOR INPUT PIN ESD PROTECTION WITH FLOATING AND/OR BIASED POLYSILICON REGIONS

CROSS-REFERENCES TO RELATED APPLICATIONS

This application claims priority to Chinese Patent Application No. 200910247495.7, filed Dec. 29, 2009, which is commonly owned and incorporated by reference herein for all purposes.

This application is related to U.S. patent application Ser. No. 11/517,546, filed Sep. 6, 2006, and to U.S. patent application Ser. No. 11/550,529, filed Oct. 18, 2006, now U.S. Pat. No. 7,642,602, which are commonly assigned and incorporated by reference herein for all purposes.

BACKGROUND OF THE INVENTION

Embodiments of the present invention generally relate to integrated circuits. More particularly, embodiments of the invention provide a system and method for electrostatic discharge (ESD) protection with floating and/or biased polysilicon regions. Merely by way of example, embodiments of the invention have been applied to input pins. But it would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as a given process and/or device layout often work down to only a certain feature size. An example of such a limit is the input pin ESD protection provided by certain transistors. An effective protection often requires lowering breakdown voltages of these transistors, but reducing the breakdown voltages can be difficult. Conventionally, an ESD implant may be used for adjusting the breakdown voltages, but the ESD implant often increases fabrication complexity with limited effectiveness.

From the above, it is seen that an improved technique for ESD protection is desired.

BRIEF SUMMARY OF THE INVENTION

Embodiments of the present invention relate to integrated circuits. More particularly, embodiments of the invention provide a system and method for electrostatic discharge (ESD) protection with floating and/or biased polysilicon regions. Merely by way of example, embodiments of the invention have been applied to input pins. But it would be recognized that the invention has a much broader range of applicability.

A specific embodiment of the invention provides a system for electrostatic discharge protection. The system includes a first transistor including a first drain, a second transistor including a second drain, and a resistor including a first terminal and a second terminal. The first terminal is coupled to the first drain and the second drain. Additionally, the system includes a third transistor coupled to the second terminal and a protected system. The third transistor includes a first gate, a first dielectric layer located between the first gate and a first substrate, a first source, and a third drain. The protected system includes a fourth transistor, and the fourth transistor includes a second gate, a second dielectric layer located between the second gate and a second substrate, a second source, and a fourth drain. The third transistor is selected from a plurality of transistors, and the plurality of transistors includes a plurality of gate regions, a plurality of source regions, and a plurality of drain regions. Each of the plurality of gate regions intersects a polysilicon region, and the polysilicon region is separated from the first substrate by a third dielectric layer. At least a part of the polysilicon region is located on an active area.

According to another embodiment, a system for electrostatic discharge protection includes a first transistor including a first drain, a second transistor including a second drain, and a resistor including a first terminal and a second terminal. The first terminal is coupled to the first drain and the second drain. Additionally, the system includes a third transistor coupled to the second terminal and a protected system. The third transistor includes a first gate, a first dielectric layer located between the first gate and a first substrate, a first source, and a first drain. The protected system includes a fourth transistor, and the fourth transistor includes a second gate, a second dielectric layer located between the second gate and a second substrate, a second source, and a fourth drain. The third transistor is selected from a plurality of transistors, and the plurality of transistors includes a plurality of gate regions, a plurality of source regions, and a plurality of drain regions. The first substrate is separated from a first plurality of polysilicon regions by a first plurality of dielectric layers. At least a part of each of the first plurality of polysilicon regions is located on an active area, and the first plurality of polysilicon regions are not in direct contact with each other.

According yet another embodiment, a system for electrostatic discharge protection includes a first transistor including a first drain, a second transistor including a second drain, and a resistor including a first terminal and a second terminal. The first terminal is coupled to the first drain and the second drain. Additionally, the system includes a third transistor coupled to the second terminal and a protected system. The third transistor includes a first gate, a first dielectric layer located between the first gate and a first substrate, a first source, and a first drain. The protected system includes a fourth transistor, the fourth transistor including a second gate, a second dielectric layer located between the second gate and a second substrate, a second source, and a fourth drain. The third transistor is selected from a plurality of transistors, and the plurality of transistors includes a plurality of gate regions, a plurality of source regions, and a plurality of drain regions. The first substrate is separated from a plurality of polysilicon regions by a plurality of dielectric layers, and the plurality of polysilicon regions is on one of the plurality of drain regions or one of the plurality of source regions. The plurality of polysilicon regions is not in direct contact with each other, and each of the plurality of polysilicon regions is not in direct contact with anyone of the plurality of gate regions.

Embodiments of the present invention provide many benefits over conventional techniques. For example, the present technique provides an easy to use system and method. According to some embodiments, the system and method are compatible with conventional technology. Some embodiments of the present invention improve the input pin ESD protection technique. For example, the junction breakdown voltages of certain protection transistors are lowered. In another example, the protection transistors enter the breakdown mode in the off state and thus prevent or reduce damages to the core transistors from ESD stress. Certain embodiments of the present invention can effectively delay the time when the ESD stress current reaches the gate regions. For example, the channels formed under the polysilicon regions have significant resistance, which can lengthen the current paths. Some embodiments of the present invention comply with the ESD design rule. For example, to dissipate significant heat generated by high-density ESD current, the ESD design rule often allows relatively large spacing between the gate regions and drain contacts. In another example, the spacing is equal to or longer than 1.72 μm. Accordingly, the polysilicon regions can be inserted to the drain regions of the protection transistors in order to increase lengths of the current paths and raise the drain resistance without violating the ESD design rule. Certain embodiments of the present invention provide junction doping profiles between LDD regions and pocket implant regions related to floating and/or biased polysilicon regions, which is steeper than junction doping profiles between LDD regions and pocket implant regions for protection transistors. Some embodiments of the present invention significantly lower junction breakdown voltage of secondary transistors until the primary ESD transistors are fully functional to protect the input pin. For example, the secondary transistors with lowered junction breakdown voltage can effectively limit the voltage or current of the protected system until the primary ESD transistors are fully operational for protection. Some embodiments of the present invention use certain protection transistors that are the same as the protected transistors, such as the core transistors. Depending upon the embodiment, one or more of these benefits may be achieved. These and other benefits will be described in more detail throughout the present specification and more particularly below.

Various additional objects, features and advantages of the present invention can be more fully appreciated with reference to the detailed description and accompanying drawings that follow.

BRIEF DESCRIPTION OF THE DRAWINGS

FIGS. 7(A) and (B) are simplified diagrams showing systems for electrostatic discharge protection according to yet another embodiment of the present invention;

FIGS. 8(A), (B), and (C) are simplified diagrams showing systems for electrostatic discharge protection according to yet other embodiments of the present invention;

FIGS. 9(A), (B), (C), and (D) are simplified diagrams showing certain details of systems for electrostatic discharge protection according to certain embodiments of the present invention.

DETAILED DESCRIPTION OF THE INVENTION

Embodiments of the present invention relate to integrated circuits. More particularly, embodiments of the invention provide a system and method for electrostatic discharge (ESD) protection with floating and/or biased polysilicon regions. Merely by way of example, the invention has been applied to input pins. But it would be recognized that the invention has a much broader range of applicability.

Figure 1:
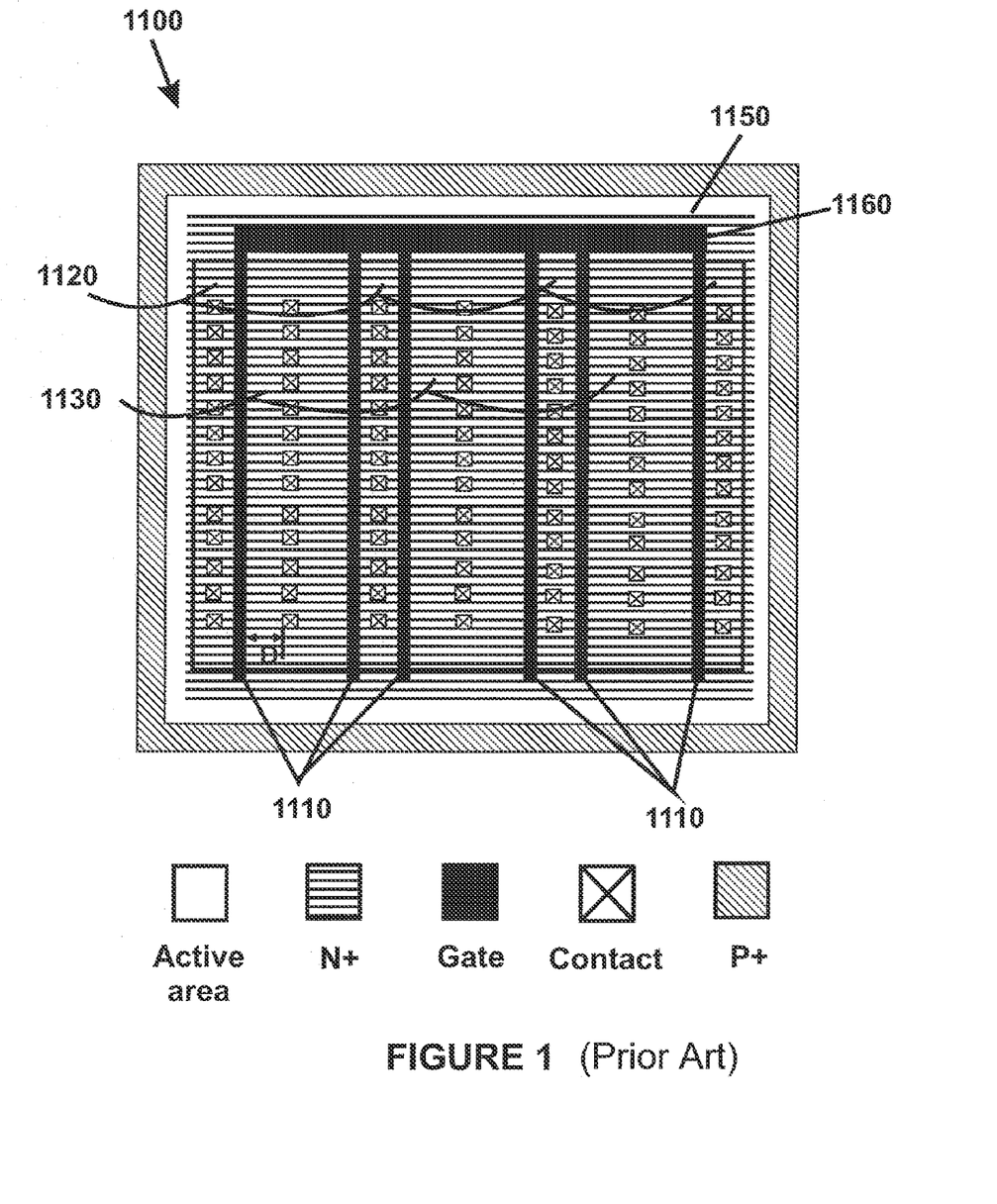
FIG. 1 is a simplified conventional system for electrostatic discharge protection.

FIG. 1 is a simplified conventional system for electrostatic discharge protection. The system 1100 includes gate regions 1110, source regions 1120, drain regions 1130, an active area 1150, and a polysilicon region 1160. The gate regions 1110, the source regions 1120, and the drain regions 1130 are used to form I/O transistors in the active area 1150. The gate regions are electrically shorted to each other by the polysilicon region 1160, and the polysilicon region 1160 is located completely outside the active area 1150.

Figure 2:
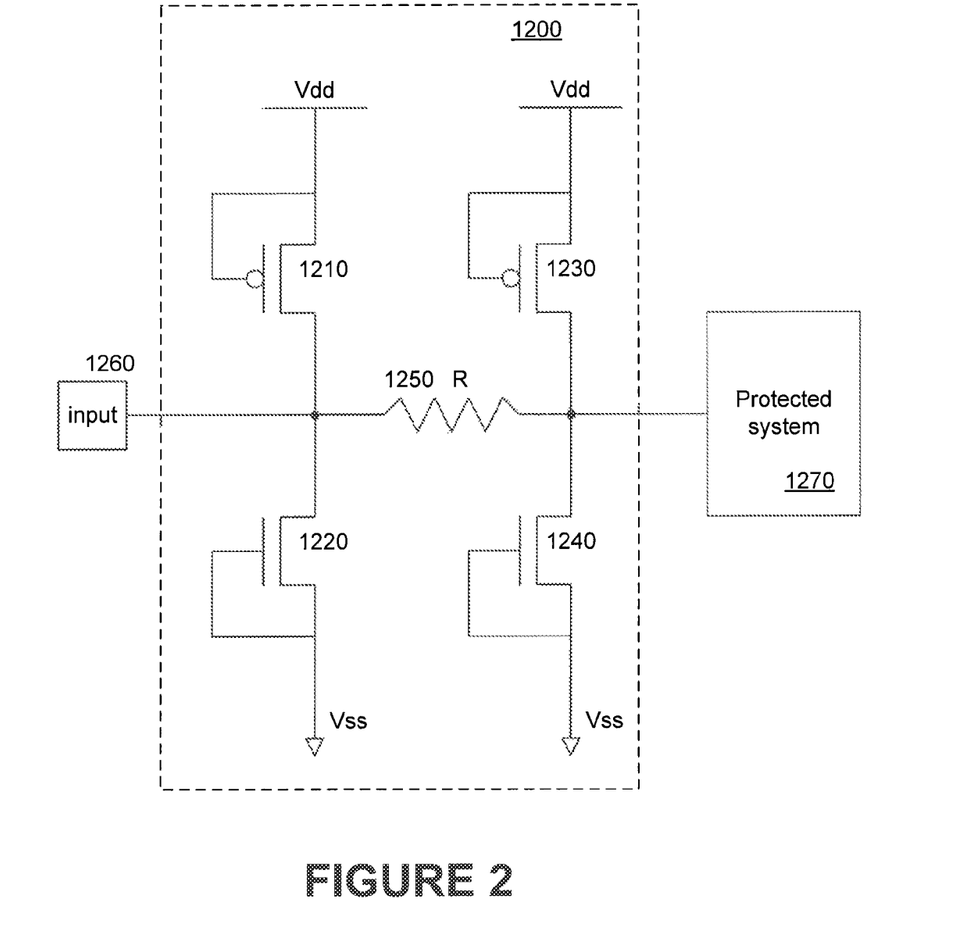
FIG. 2 is a simplified system for electrostatic discharge protection according to an embodiment of the present invention.

FIG. 2 is a simplified system for electrostatic discharge protection according to an embodiment of the present invention. This diagram is merely an example, which should not unduly limit the scope of the claims. One of ordinary skill in the art would recognize many variations, alternatives, and modifications. The system 1200 for electrostatic discharge protection includes PMOS transistors 1210 and 1230, NMOS transistors 1220 and 1240, and a resistor 1250. The source and the gate of the PMOS transistor 1210 are biased to a voltage level $V_{DD}$, and the source and the gate of the NMOS transistor 1220 are biased to a voltage level $V_{SS}$. The drain of the PMOS transistor 1210 and the drain of the NMOS transistor 1220 are connected to an input pin 1260 and the resistor 1250. Additionally, the source and the gate of the PMOS transistor 1230 are biased to the voltage level $V_{DD}$, and the source and the gate of the NMOS transistor 1240 are biased to the voltage level $V_{SS}$. The drain of the PMOS transistor 1230 and the drain of the NMOS transistor 1240 are connected to the resistor 1250 and a protected system 1270. For example, the protected system 1270 is protected by the system 1200. In another example, the protected system 1270 includes one or more protected transistors, such as core transistors. The PMOS transistor 1230 represents one or more protection transistors and the NMOS transistor 1240 represents one or more protection transistors according to certain embodiments of the present invention as described in FIGS. 3, 4, 5, 6, 7(A) and (B), 8(A), 8(B), 8(C), 9(A), 9(B), 9(C), and/or 9(D).

Figure 3:
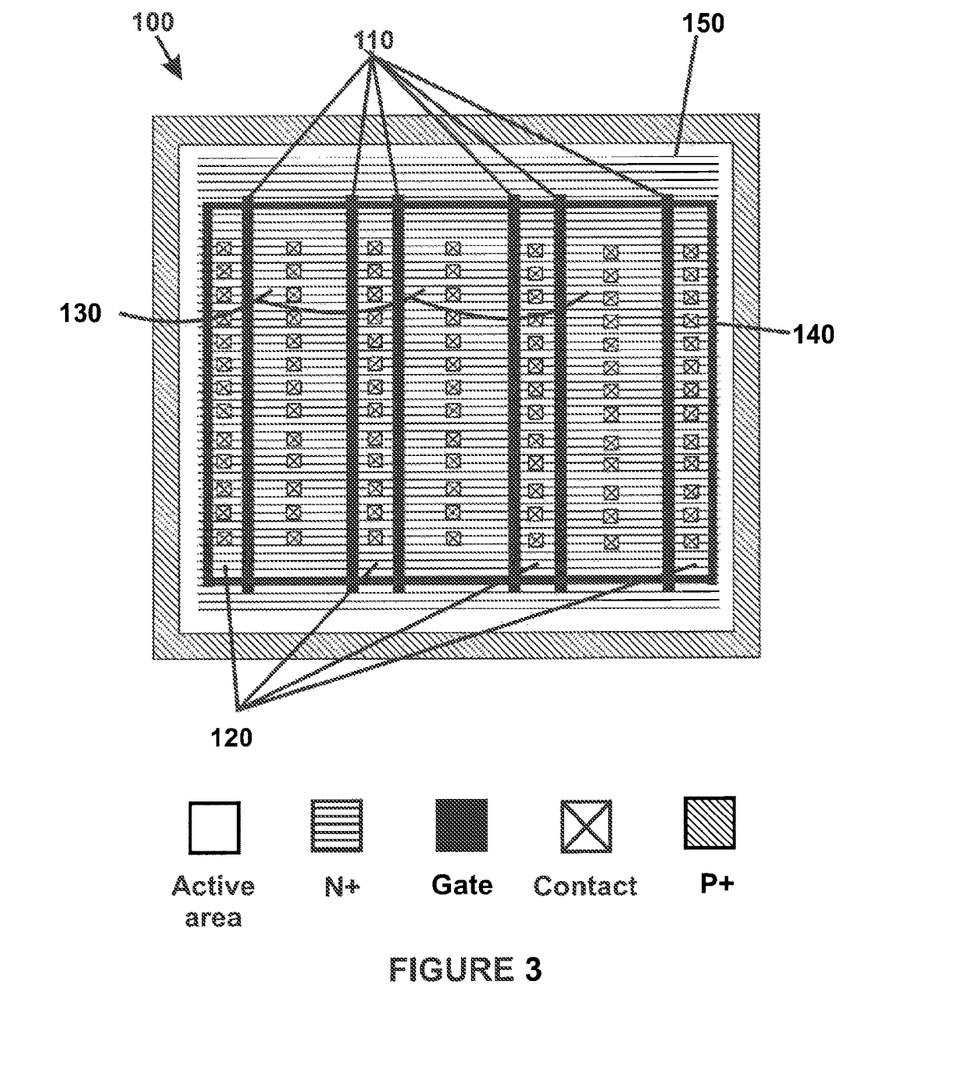
FIG. 3 is a simplified system for electrostatic discharge protection according to an embodiment of the present invention.

FIG. 3 is a simplified system for electrostatic discharge protection according to an embodiment of the present invention. This diagram is merely an example, which should not unduly limit the scope of the claims. One of ordinary skill in the art would recognize many variations, alternatives, and modifications. The system 100 includes the following components:

1. Gate regions 110;
2. Source regions 120;
3. Drain regions 130;
4. Polysilicon region 140;
5. Active area 150.

Although the above has been shown using a selected group of components for the system 100, there can be many alternatives, modifications, and variations. For example, some of the components may be expanded and/or combined. Other components may be inserted to those noted above. For example, the regions 120 can serve as drains, and the regions 130 can serve as sources. Depending upon the embodiment, the arrangement of components may be interchanged with others replaced. For example, the protection transistors in the active area 150 are PMOS transistors. Further details of these components are found throughout the present specification and more particularly below.

The gate regions 110, the source regions 120, and the drain regions 130 are used to form protection transistors in the active area 150. The protection transistors also include gate dielectric layers, such as gate oxide layers, respectively. For example, the active area 150 includes the source regions 120 and the drain regions 130. In another example, each of the source regions 120 includes a doped region, and each of the drain regions 130 includes a doped region. In yet another example, the protection transistors in the active area 150 are NMOS transistors. As shown in FIG. 3, the polysilicon region 140 intersects the gate regions 110. The gate regions 110 are electrically connected to the polysilicon region 140. In one embodiment, the polysilicon region 140 has the same voltage potential as the gate regions 110. In another embodiment, the polysilicon region 140 surrounds the source regions 120 and the drain regions 130. For example, the polysilicon region 140 is partially or completely located within the active area 150. In another example, the gate regions 110 are electrically shorted to each other by another polysilicon region located outside the active area 150.

Figure 4:
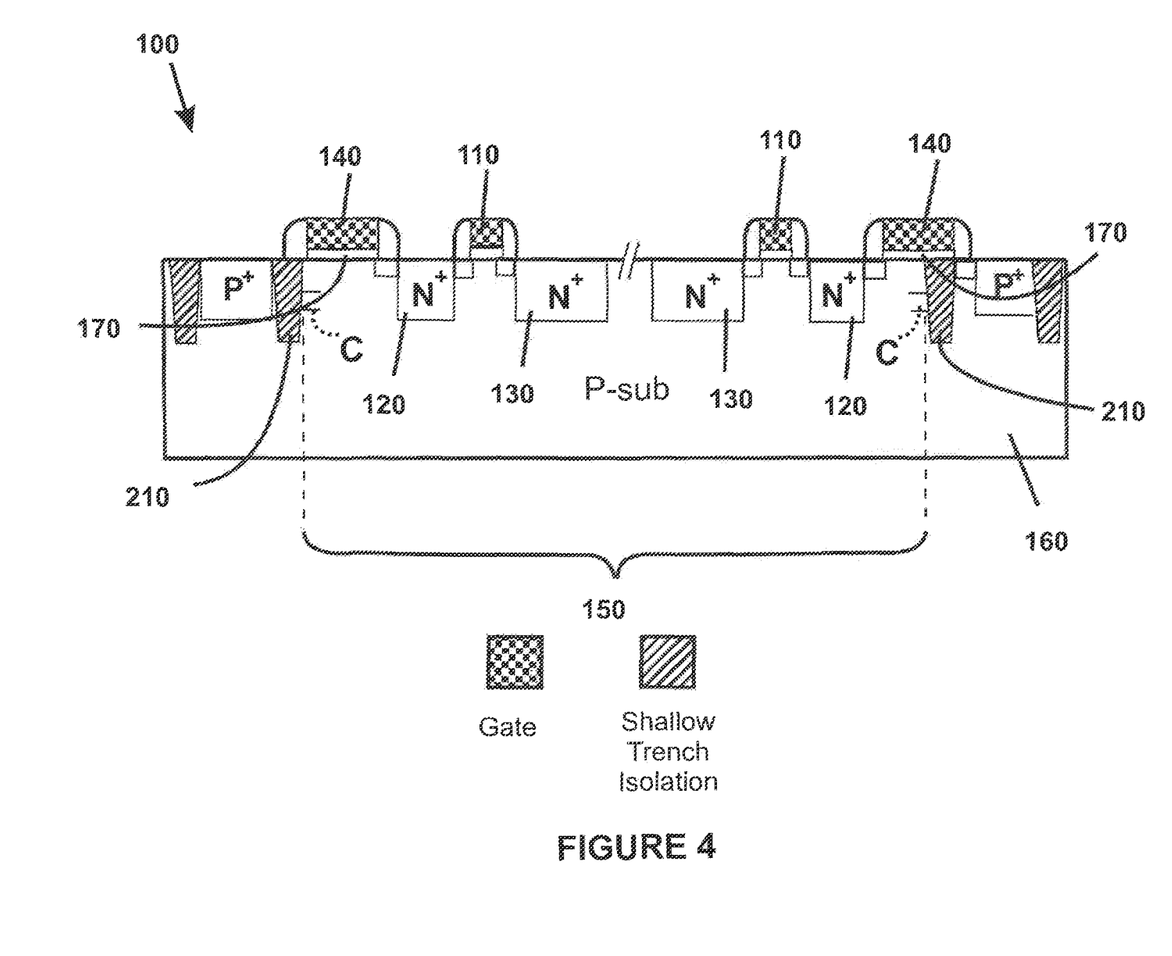
FIG. 4 is a simplified cross-section for electrostatic discharge protection according to an embodiment of the present invention.

FIG. 4 is a simplified cross-section for the system 100 for electrostatic discharge protection according to an embodiment of the present invention. This diagram is merely an example, which should not unduly limit the scope of the claims. One of ordinary skill in the art would recognize many variations, alternatives, and modifications. As shown in FIG. 4, the active area 150 is isolated by shallow trench isolation (STI) regions 210. For example, in the top view, the polysilicon region 140 is partially located within the active area 150 for the I/O transistors. Additionally, the system 100 also includes a substrate 160 and a dielectric layer 170. The substrate 160 includes the active area 150, and is separated from the polysilicon region 140 by the dielectric layer 170. For example, the dielectric layer 170 includes silicon oxide.

The protection transistors of the system 100 can be used as the transistor 1230 and/or the transistor 1240 in the system 1200. The system 1200 can provide ESD protection to the system 1270. For example, the protected system 1270 includes one or more protected transistors, such as core transistors. A protected transistor includes a gate region, a gate dielectric layer, a source region, and a drain region. For example, the gate dielectric layer includes a gate oxide layer. In one embodiment, the gate region of the protected transistor has the same composition and the same thickness as the polysilicon region 140. In another embodiment, the gate dielectric layer of the protected transistor has the same composition and the same thickness as the dielectric layer 170. In yet another embodiment, the gate region, the gate dielectric layer, the source region, and the drain region of a protected transistor is the same as the gate region, the gate dielectric layer, the source region, and the drain region of a protection transistor respectively.

Figure 5:
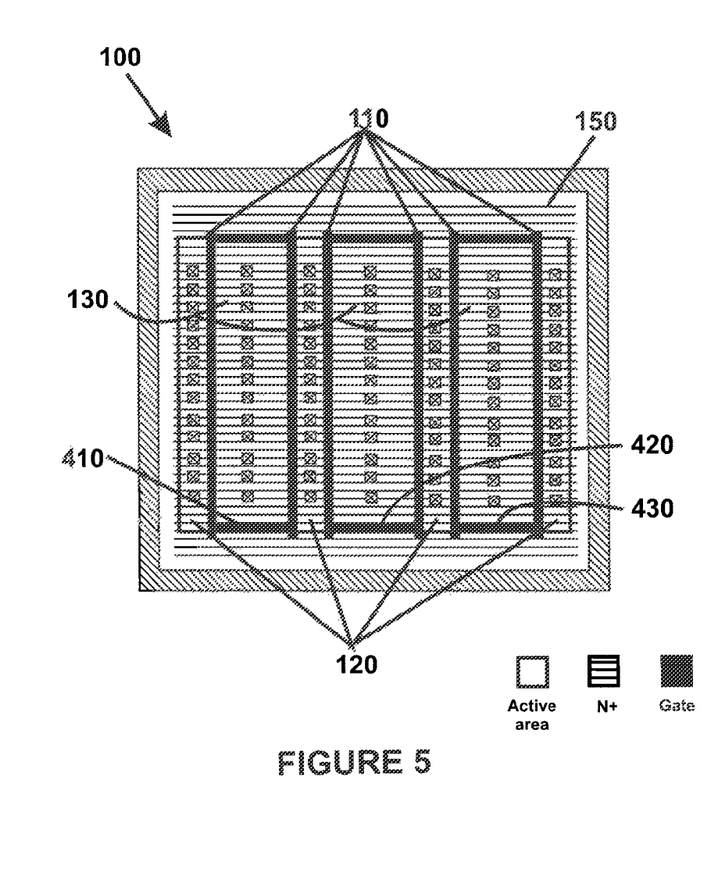
FIG. 5 is a simplified system for electrostatic discharge protection according to another embodiment of the present invention.

As discussed above and further emphasized here, FIGS. 3 and 4 are merely examples, which should not unduly limit the scope of the claims. One of ordinary skill in the art would recognize many variations, alternatives, and modifications. FIG. 5 is a simplified system for electrostatic discharge protection according to another embodiment of the present invention. The polysilicon region 140 in the system 100 is replaced by polysilicon regions 410, 420, and 430. For example, the polysilicon regions 410, 420, and 430 and the gate regions 110 surround the drain regions 130. The polysilicon regions 410, 420, and 430 are partially or completely located within the active area 150, and separated from the substrate by dielectric layers. For example, the dielectric layers include silicon oxide. In another example, the dielectric layers are separated from each other or in contact with each other. In yet another example, the gate regions 110 are electrically shorted to each other by another polysilicon region located outside the active area 150.

The protection transistors of the system 100 can be used as the transistor 1230 and/or the transistor 1240 in the system 1200. The system 1200 can provide ESD protection to the system 1270. For example, the protected system 1270 includes one or more protected transistors, such as core transistors. A protected transistor includes a gate region, a gate dielectric layer, a source region, and a drain region. For example, the gate dielectric layer includes a gate oxide layer. In one embodiment, the gate region of the protected transistor has the same composition and the same thickness as the polysilicon regions 410, 420, and 430. In another embodiment, the gate dielectric layer of the protected transistor has the same composition and the same thickness as the dielectric layers separating the polysilicon regions 410, 420, and 430 from the substrate. In yet another embodiment, the gate region, the gate dielectric layer, the source region, and the drain region of a protected transistor is the same as the gate region, the gate dielectric layer, the source region, and the drain region of a protection transistor respectively.

Figure 6:
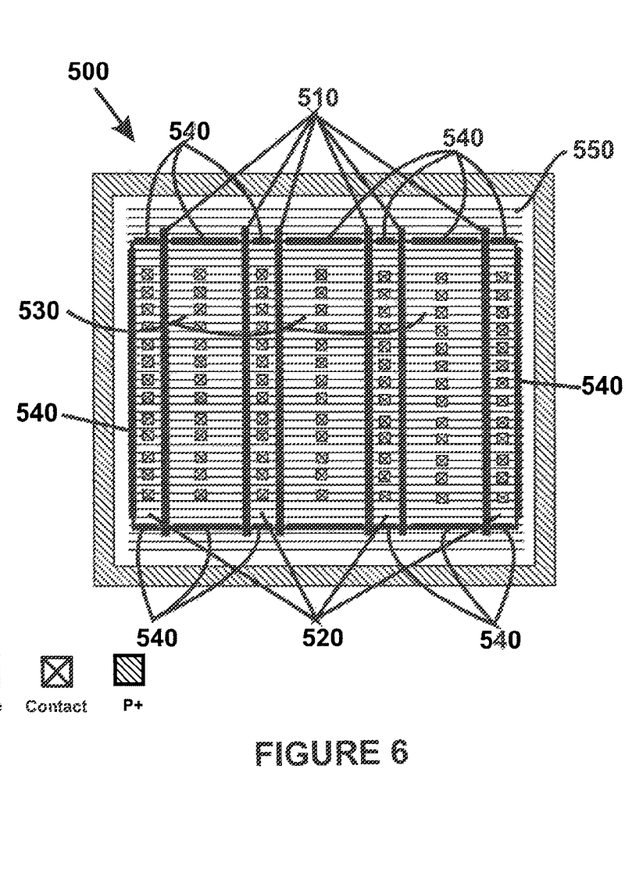
FIG. 6 is a simplified system for electrostatic discharge protection according to yet another embodiment of the present invention.

FIG. 6 is a simplified system for electrostatic discharge protection according to yet another embodiment of the present invention. This diagram is merely an example, which should not unduly limit the scope of the claims. One of ordinary skill in the art would recognize many variations, alternatives, and modifications. The system 500 includes the following components:

1. Gate regions 510;
2. Source regions 520;
3. Drain regions 530;
4. Polysilicon region 540;
5. Active area 550.

Although the above has been shown using a selected group of components for the system 500, there can be many alternatives, modifications, and variations. For example, some of the components may be expanded and/or combined. Other components may be inserted to those noted above. For example, the regions 520 can serve as drains, and the regions 530 can serve as sources. Depending upon the embodiment, the arrangement of components may be interchanged with others replaced. For example, the protection transistors in the active area 550 are PMOS transistors. Further details of these components are found throughout the present specification and more particularly below.

The gate regions 510, the source regions 520, and the drain regions 530 are used to form protection transistors in the active area 550. The protection transistors also include gate dielectric layers, such as gate oxide layers, respectively. For example, the active area 550 includes the source regions 520 and the drain regions 530. In another example, the protection transistors in the active area 550 are NMOS transistors. As shown in FIG. 6, the polysilicon region 540 does not intersect the gate regions 510. The gate regions 510 are not in direct contact with the polysilicon region 540. For example, the polysilicon region 540 includes a plurality of sub-regions, and the plurality of sub-regions is not in direct contact with each other.

In one embodiment, the polysilicon region 540 is at least partially around the source regions 520 and the drain regions 530. In another embodiment, the polysilicon region 540 is partially or completely located within the active area 550. In yet another embodiment, the polysilicon region 540 is separated from the substrate by dielectric layers. For example, the dielectric layers include silicon oxide. In another example, the dielectric layers are separated from each other or in direct contact with each other. In yet another embodiment, the gate regions 510 are electrically shorted to each other by another polysilicon region located outside the active area 550.

The protection transistors of the system 500 can be used as the transistor 1230 and/or the transistor 1240 in the system 1200. The system 1200 can provide ESD protection to the system 1270. For example, the protected system 1270 includes one or more protected transistors, such as core transistors. A protected transistor includes a gate region, a gate dielectric layer, a source region, and a drain region. For example, the gate dielectric layer includes a gate oxide layer. In one embodiment, the gate region of the protected transistor has the same composition and the same thickness as the polysilicon region 540. In another embodiment, the gate dielectric layer of the protected transistor has the same composition and the same thickness as the dielectric layers separating the polysilicon region 540 from the substrate. In yet another embodiment, the gate region, the gate dielectric layer, the source region, and the drain region of a protected transistor is the same as the gate region, the gate dielectric layer, the source region, and the drain region of a protection transistor respectively.

Figure 7:
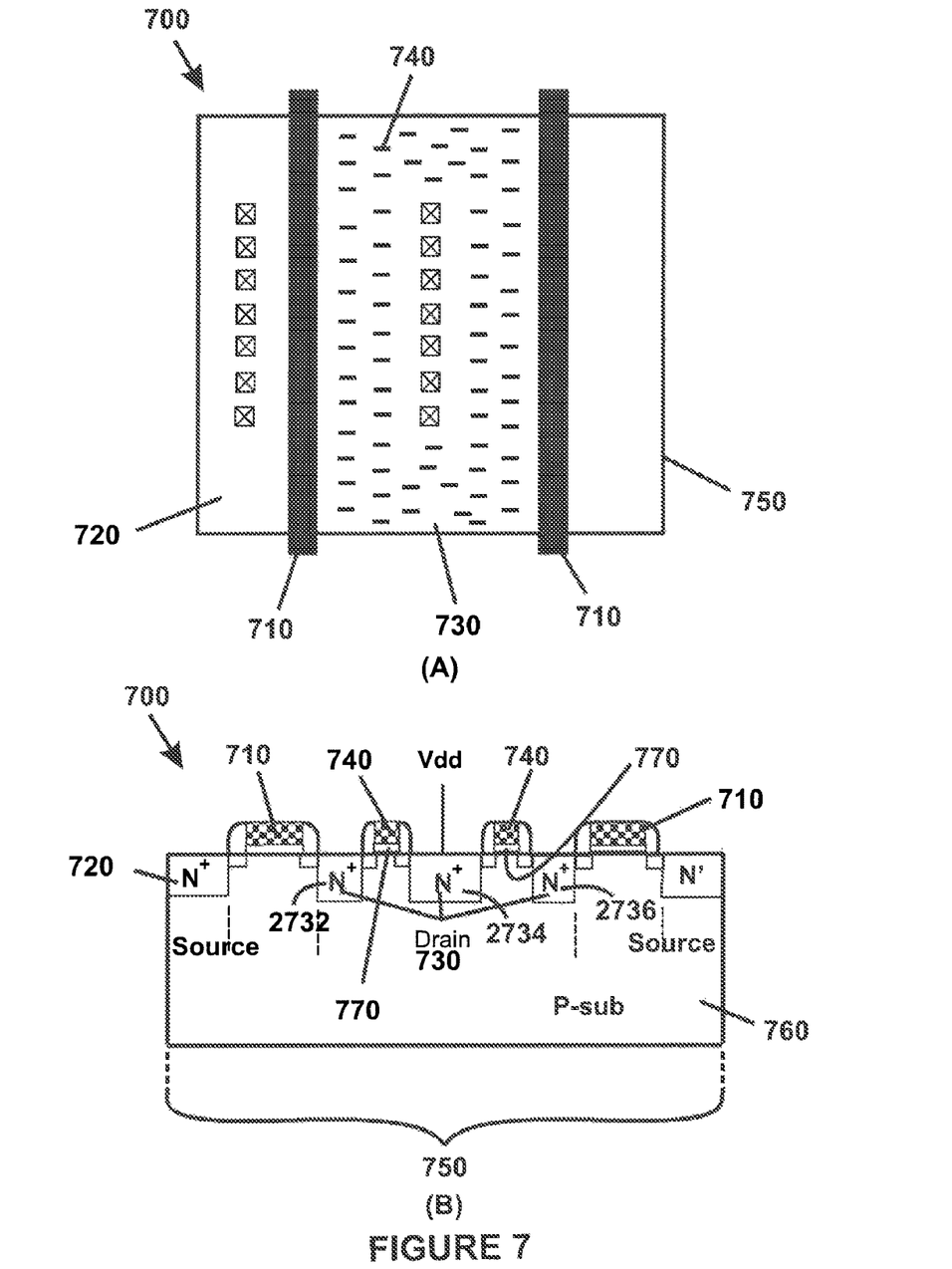

FIGS. 7(A) and (B) are simplified diagrams showing system for electrostatic discharge protection according to yet another embodiment of the present invention. This diagram is merely an example, which should not unduly limit the scope of the claims. One of ordinary skill in the art would recognize many variations, alternatives, and modifications. The system 700 includes the following components:

1. Gate regions 710;
2. Source regions 720;
3. Drain regions 730;
4. Polysilicon regions 740;
5. Active area 750;
6. Substrate 760;
7. Dielectric layers 770.

Although the above has been shown using a selected group of components for the system 700, there can be many alternatives, modifications, and variations. For example, some of the components may be expanded and/or combined. Other components may be inserted to those noted above. For example, the regions 720 can serve as drains, and the regions 730 can serve as sources. Depending upon the embodiment, the arrangement of components may be interchanged with others replaced. For example, the I/O transistors in the active area 750 are PMOS transistors. Further details of these components are found throughout the present specification and more particularly below.

The gate regions 710, the source regions 720, and the drain regions 730 are used to form protection transistors in the active area 750. The protection transistors also include gate dielectric layers, such as gate oxide layers, respectively. For example, the active area 750 includes the source regions 720 and the drain regions 730. In another example, the protection transistors in the active area 750 are NMOS transistors.

As shown in FIG. 7(A), the polysilicon regions 740 are not in direct contact with the gate regions 710, and the polysilicon regions 740 are not in direct contact with each other. In one embodiment, the polysilicon regions 740 are located within the drain regions 730 in the top view. In another embodiment, the polysilicon regions 740 are located within the source regions 720 in the top view. In yet another embodiment, the polysilicon regions 740 are located within both the source regions 720 and the drain regions 730 in the top view. In yet another embodiment, the gate regions 710 are electrically shorted to each other by another polysilicon region located outside the active area 750.

As shown in FIG. 7(B), the substrate 760 includes the active area 750, and is separated from the polysilicon regions 740 by the dielectric layers 770. For example, the dielectric layers 770 include silicon oxide. In another example, the dielectric layers 770 are separated from each other or in direct contact with each other. Each of the source regions 720 includes a doped region, and each of the drain regions 730 includes doped regions 2732, 2734, and 2736 in the substrate 760. The doped regions 2732, 2734, and 2736 are not in direct contact with each other. In one embodiment, the substrate 760 is doped to p-type, and the doped regions 2732, 2734, and 2736 are N+ regions. For example, the substrate 760 also includes a p-well. In another example, the substrate 760 also includes at least two LDD regions for each of the doped regions 2732, 2734, and 2736. The two LDD regions are in direct contact with the corresponding doped region. In yet another example, the substrate 760 also includes two p-type regions made by pocket implants for each of the doped regions 2732, 2734, and 2736.

The protection transistors of the system 700 can be used as the transistor 1230 and/or the transistor 1240 in the system 1200. The system 1200 can provide ESD protection to the system 1270. For example, the protected system 1270 includes one or more protected transistors, such as core transistors. A protected transistor includes a gate region, a gate dielectric layer, a source region, and a drain region. For example, the gate dielectric layer includes a gate oxide layer. In one embodiment, the gate region of the protected transistor has the same composition and the same thickness as the polysilicon regions 740. In another embodiment, the gate dielectric layer of the protected transistor has the same composition and the same thickness as the dielectric layers 770 separating the polysilicon regions 740 from the substrate 760. In yet another embodiment, the gate region, the gate dielectric layer, the source region, and the drain region of a protected transistor is the same as the gate region, the gate dielectric layer, the source region, and the drain region of a protection transistor respectively.

Figure 8:
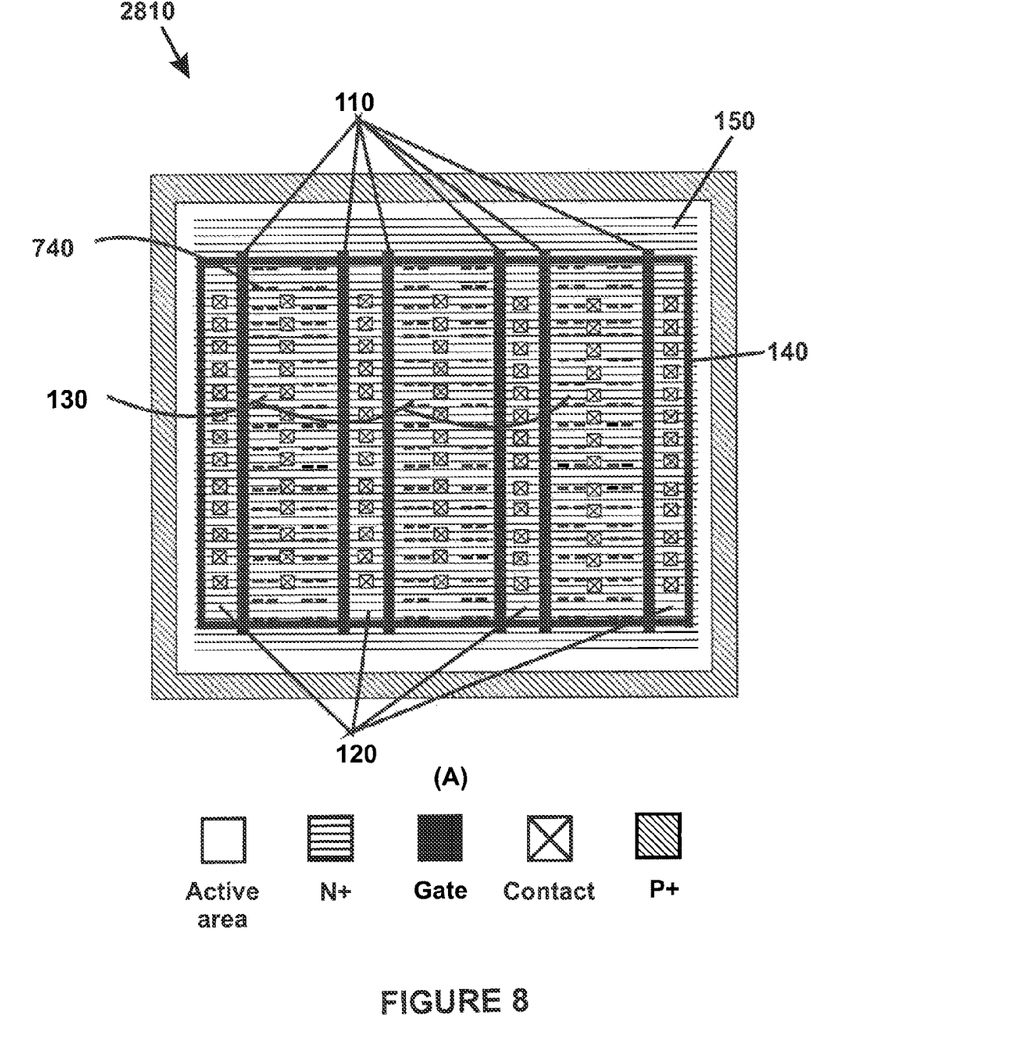

As discussed above and further emphasized here, FIGS. 7(A) and (B) are merely examples, which should not unduly limit the scope of the claims. One of ordinary skill in the art would recognize many variations, alternatives, and modifications. FIGS. 8(A), (B), and (C) are simplified diagrams showing systems for electrostatic discharge protection according to yet other embodiments of the present invention. These diagrams are merely examples, which should not unduly limit the scope of the claims. One of ordinary skill in the art would recognize many variations, alternatives, and modifications.

In FIG. 8(A), the polysilicon regions 740 are added to the system 100 as shown in FIG. 3 to form a system 2810 for ESD protection. The polysilicon regions 740 are not in direct contact with the gate regions 110 or the polysilicon regions 140, and the polysilicon regions 740 are not in direct contact with each other. Additionally, the polysilicon regions 740 are separated from the substrate by the dielectric layers. For example, the dielectric layers include silicon oxide. In another example, the dielectric layers are separated from each other or in direct contact with each other. In one embodiment, the polysilicon regions 740 are located within the drain regions 130 in the top view. In another embodiment, the polysilicon regions 740 are located within the source regions 120 in the top view. In yet another embodiment, the polysilicon regions 740 are located within both the source regions 120 and the drain regions 130 in the top view. For example, each of the drain regions 130 includes several doped regions in the substrate. The doped regions are not in direct contact with each other. In one embodiment, the substrate is doped to p-type, and the doped regions are N+ regions. For example, the substrate also includes a p-well. In another example, the substrate also includes at least two LDD regions for each of the doped regions. The two LDD regions are in direct contact with the corresponding doped region. In yet another example, the substrate also includes two p-type regions made by pocket implants for each of the doped regions. In yet another embodiment, the gate regions 110 are electrically shorted to each other by another polysilicon region located outside the active area 150.

In FIG. 8(B), the polysilicon regions 740 are added to the system 100 as shown in FIG. 5 to form a system 2820 for ESD protection. The polysilicon regions 740 are not in direct contact with the gate regions 110 or the polysilicon regions 410, 420, and 430, and the polysilicon regions 740 are not in direct contact with each other. Additionally, the polysilicon regions 740 are separated from the substrate by the dielectric layers. For example, the dielectric layers include silicon oxide. In another example, the dielectric layers are separated from each other or in direct contact with each other. In one embodiment, the polysilicon regions 740 are located within the drain regions 130 in the top view. In another embodiment, the polysilicon regions 740 are located within the source regions 120 in the top view. In yet another embodiment, the polysilicon regions 740 are located within both the source regions 120 and the drain regions 130 in the top view. For example, each of the drain regions 130 includes several doped regions in the substrate. The doped regions are not in direct contact with each other. In one embodiment, the substrate is doped to p-type, and the doped regions are N+ regions. For example, the substrate also includes a p-well. In another example, the substrate also includes at least two LDD regions for each of the doped regions. The two LDD regions are in direct contact with the corresponding doped region. In yet another example, the substrate also includes two p-type regions made by pocket implants for each of the doped regions. In yet another embodiment, the gate regions 110 are electrically shorted to each other by another polysilicon region located outside the active area 150.

In FIG. 8(C), the polysilicon regions 740 are added to the system 500 as shown in FIG. 6 to form a system 2830 for ESD protection. The polysilicon regions 740 are not in direct contact with the gate regions 110 or the polysilicon regions 540, and the polysilicon regions 740 are not in direct contact with each other. Additionally, the polysilicon regions 740 are separated from the substrate by the dielectric layers. For example, the dielectric layers include silicon oxide. In another example, the dielectric layers are separated from each other or in direct contact with each other. In one embodiment, the polysilicon regions 740 are located within the drain regions 530 in the top view. In another embodiment, the polysilicon regions 740 are located within the source regions 520 in the top view. In yet another embodiment, the polysilicon regions 740 are located within both the source regions 520 and the drain regions 530 in the top view. For example, each of the drain regions 530 includes several doped regions in the substrate. The doped regions are not in direct contact with each other. In one embodiment, the substrate is doped to p-type, and the doped regions are N+ regions. For example, the substrate also includes a p-well. In another example, the substrate also includes at least two LDD regions for each of the doped regions. The two LDD regions are in direct contact with the corresponding doped region. In yet another example, the substrate also includes two p-type regions made by pocket implants for each of the doped regions. In yet another embodiment, the gate regions 510 are electrically shorted to each other by another polysilicon region located outside the active area 550.

The protection transistors as shown in FIGS. 8(A), (B), and/or (C) can be used as the transistor 1230 and/or the transistor 1240 in the system 1200. The system 1200 can provide ESD protection to the system 1270. For example, the protected system 1270 includes one or more protected transistors, such as core transistors. A protected transistor includes a gate region, a gate dielectric layer, a source region, and a drain region. For example, the gate dielectric layer includes a gate oxide layer. In one embodiment, the gate region of the protected transistor has the same composition and the same thickness as the polysilicon regions 740. In another embodiment, the gate dielectric layer of the protected transistor has the same composition and the same thickness as the dielectric layers 770 separating the polysilicon regions 740 from the substrate 760. In yet another embodiment, the gate region, the gate dielectric layer, the source region, and the drain region of a protected transistor is the same as the gate region, the gate dielectric layer, the source region, and the drain region of a protection transistor respectively.

Figure 9:
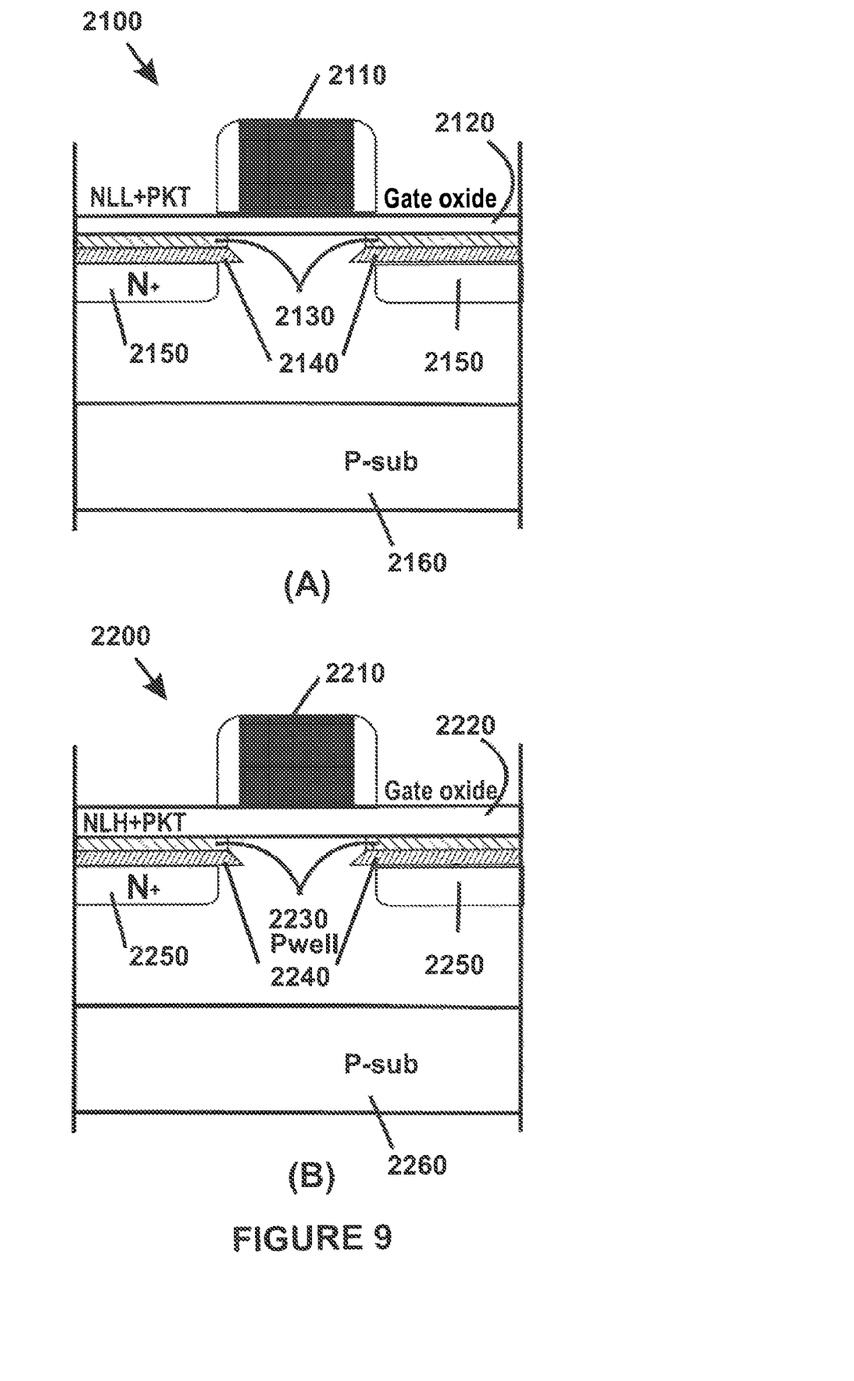

FIGS. 9(A), (B), (C), and (D) are simplified diagrams showing certain details of systems for electrostatic discharge protection according to certain embodiments of the present invention. These diagrams are merely examples, which should not unduly limit the scope of the claims. One of ordinary skill in the art would recognize many variations, alternatives, and modifications.

FIG. 9(A) shows a protected transistor 2100. The protected transistor 2100 includes a gate region 2110, a gate dielectric layer 2120, LDD regions 2130, pocket implant regions 2140, heavily doped regions 2150, and a substrate 2160. In one embodiment, the protected transistor 2100 is a part of the protected system 1270.

FIG. 9(B) shows a protection transistor 2200. The protection transistor 2200 includes a gate region 2210, a gate dielectric layer 2220, LDD regions 2230, pocket implant regions 2240, heavily doped regions 2250, and a substrate 2260. In one embodiment, the protection transistor 2200 is one of the protection transistors of the systems 100, 500, 700, 2810, 2820, and/or 2830. For example, one of the heavily doped regions 2250 corresponds to the doped region for the source region 120, and another of the heavily doped regions 2250 corresponds to the doped region for the drain region 130. In another example, one of the heavily doped regions 2250 corresponds to the doped region 2732 or 2736, and another of the heavily doped regions 2250 corresponds to the doped region for the source region 720.

FIG. 9(C) shows a structure 2300. The structure 2300 includes a polysilicon region 2310, a dielectric layer 2320, an LDD region 2330, a pocket implant region 2340, a heavily doped region 2350, and a substrate 2360. In one embodiment, the structure 2300 is a cross-section related to the polysilicon regions 140, 410, 420, 430, and/or 540. For example, the polysilicon region 2310 corresponds to the polysilicon regions 140, 410, 420, 430, or 540. In another example, the heavily doped region 2350 corresponds to the doped region for the source region 120 adjacent to the polysilicon region 140.

FIG. 9(D) shows a structure 2400. The structure 2400 includes a polysilicon region 2410, a dielectric layer 2420, LDD regions 2430, pocket implant regions 2440, heavily doped regions 2450, and a substrate 2460. In one embodiment, the structure 2400 is a cross-section related to the polysilicon regions 740. For example, the polysilicon region 2410 corresponds to one of the polysilicon regions 740. In another example, one of the heavily doped regions 2450 corresponds to the doped region 2732 or 2736, and another of the heavily doped regions 2450 corresponds to the doped region for the source region 720.

Although the above has been shown using a selected group of components for the structures 2100, 2200, 2300, and 2400, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification and more particularly below.

As shown in FIGS. 9(A), (B), and (C), the gate region 2110 has the same composition and the same thickness as the polysilicon region 2310. The dielectric layer 2120 has the same composition and the same thickness as the dielectric layer 2320, and the LDD regions 2130 have the same doping profile as the LDD region 2330. For example, the LDD regions 2130 and the LDD region 2330 are formed by implantation of argon ions with implant energy of 3 KeV and dose of $1.1 \times 10^{15}$ cm$^{-3}$. The pocket implant regions 2140 have the same doping profile as the pocket implant region 2340. For example, the junction depth for the LDD regions 2130 and the pocket implant regions 2140 is the same as the junction depth for the LDD region 2330 and the pocket implant region 2340. In yet another example, the structures 2100 and 2300 are formed by at least some same fabrication processes.

According to certain embodiments, the gate region 2110 has the same composition and the same thickness as the gate region 2210. The dielectric layer 2120 has the same composition and the same thickness as the dielectric layer 2220, and the LDD regions 2130 have the same doping profile as the LDD region 2230. For example, the LDD regions 2130 and the LDD region 2230 are formed by implantation of argon ions with implant energy of 3 KeV and dose of $1.1 \times 10^{15}$ cm$^{-3}$. The pocket implant regions 2140 have the same doping profile as the pocket implant regions 2240. For example, the junction depth for the LDD regions 2130 and the pocket implant regions 2140 is the same as the junction depth for the LDD regions 2230 and the pocket implant regions 2240. In another example, the structures 2100 and 2200 are formed by at least some same fabrication processes.

As shown in FIGS. 9(A), (B), and (D), the gate region 2110 has the same composition and the same thickness as the polysilicon region 2410. The dielectric layer 2120 has the same composition and the same thickness as the dielectric layer 2420, and the LDD regions 2130 have the same junction depth as the LDD regions 2430. For example, the LDD regions 2130 and the LDD regions 2430 are formed by implantation of argon ions with implant energy of 3 KeV and dose of $1.1 \times 10^{15}$ cm$^{-3}$. The pocket implant regions 2140 have the same doping profile as the pocket implant regions 2440, and a different doping profile from the pocket implant regions 2240. For example, the junction depth for the LDD regions 2130 and the pocket implant regions 2140 is the same as the junction depth for the LDD regions 2430 and the pocket implant regions 2440. In another example, the structures 2100 and 2400 are formed by at least some same fabrication processes.

According to certain embodiments, the gate region 2110 has the same composition and the same thickness as the gate region 2210. The dielectric layer 2120 has the same composition and the same thickness as the dielectric layer 2220, and the LDD regions 2130 have the same junction depth as the LDD regions 2230. For example, the LDD regions 2130 and the LDD regions 2230 are formed by implantation of argon ions with implant energy of 3 KeV and dose of $1.1 \times 10^{15}$ cm$^{-3}$. The pocket implant regions 2140 have the same doping profile as the pocket implant regions 2240. For example, the junction depth for the LDD regions 2130 and the pocket implant regions 2140 is the same as the junction depth for the LDD regions 2230 and the pocket implant regions 2240. In another example, the structures 2100 and 2200 are formed by at least some same fabrication processes.

In some embodiments, the structures 2100, 2200, and 2300 are parts of the systems 100, 500, 2810, 2820, and/or 2830. In certain embodiments, the structures 2100, 2200, and 2400 are parts of the systems 700, 2810, 2820, and/or 2830.

According to another embodiment of the present invention, a system for electrostatic discharge protection includes a first transistor including a first drain, a second transistor including a second drain, and a resistor including a first terminal and a second terminal. The first terminal is coupled to the first drain and the second drain. Additionally, the system includes a third transistor coupled to the second terminal and a protected system. The third transistor includes a first gate, a first dielectric layer located between the first gate and a first substrate, a first source, and a third drain. The protected system includes a fourth transistor, and the fourth transistor includes a second gate, a second dielectric layer located between the second gate and a second substrate, a second source, and a fourth drain. The third transistor is selected from a plurality of transistors, and the plurality of transistors includes a plurality of gate regions, a plurality of source regions, and a plurality of drain regions. Each of the plurality of gate regions intersects a polysilicon region, and the polysilicon region is separated from the first substrate by a third dielectric layer. At least a part of the polysilicon region is located on an active area. For example, the system is implemented according to FIG. 2, FIG. 3, FIG. 4, FIG. 8(A), FIG. 9(A), FIG. 9(B), FIG. 9(C), and/or FIG. 9(D).

According to yet another embodiment, a system for electrostatic discharge protection includes a first transistor including a first drain, a second transistor including a second drain, and a resistor including a first terminal and a second terminal. The first terminal is coupled to the first drain and the second drain. Additionally, the system includes a third transistor coupled to the second terminal and a protected system. The third transistor includes a first gate, a first dielectric layer located between the first gate and a first substrate, a first source, and a first drain. The protected system includes a fourth transistor, and the fourth transistor includes a second gate, a second dielectric layer located between the second gate and a second substrate, a second source, and a fourth drain. The third transistor is selected from a plurality of transistors, and the plurality of transistors includes a plurality of gate regions, a plurality of source regions, and a plurality of drain regions. The first substrate is separated from a first plurality of polysilicon regions by a first plurality of dielectric layers. At least a part of each of the first plurality of polysilicon regions is located on an active area, and the first plurality of polysilicon regions are not in direct contact with each other. For example, the system is implemented according to FIG. 2, FIG. 5, FIG. 6, FIG. 8(B), FIG. 8(C), FIG. 9(A), FIG. 9(B), FIG. 9(C), and/or FIG. 9(D).

According to yet another embodiment, a system for electrostatic discharge protection includes a first transistor including a first drain, a second transistor including a second drain, and a resistor including a first terminal and a second terminal. The first terminal is coupled to the first drain and the second drain. Additionally, the system includes a third transistor coupled to the second terminal and a protected system. The third transistor includes a first gate, a first dielectric layer located between the first gate and a first substrate, a first source, and a first drain. The protected system includes a fourth transistor, the fourth transistor including a second gate, a second dielectric layer located between the second gate and a second substrate, a second source, and a fourth drain. The third transistor is selected from a plurality of transistors, and the plurality of transistors includes a plurality of gate regions, a plurality of source regions, and a plurality of drain regions. The first substrate is separated from a plurality of polysilicon regions by a plurality of dielectric layers, and the plurality of polysilicon regions is on one of the plurality of drain regions or one of the plurality of source regions. The plurality of polysilicon regions is not in direct contact with each other, and each of the plurality of polysilicon regions is not in direct contact with anyone of the plurality of gate regions. For example, the system is implemented according to FIG. 2, FIG. 7(A), FIG. 7(B), FIG. 8(A), FIG. 8(B), FIG. 8(C), FIG. 9(A), FIG. 9(B), FIG. 9(C), and/or FIG. 9(D).

The present invention has various advantages. Some embodiments of the present invention improve the input pin ESD protection technique. For example, the junction breakdown voltages of certain protection transistors are lowered. In another example, the protection transistors enter the breakdown mode in the off state and thus prevent or reduce damages to the core transistors from ESD stress. Certain embodiments of the present invention can effectively delay the time when the ESD stress current reaches the gate regions. For example, as shown in FIGS. 7(A) and (B) and 8(A), (B), and (C), the channels formed under the polysilicon regions 740 have significant resistance, which can lengthen the current paths. Some embodiments of the present invention comply with the ESD design rule. For example, to dissipate significant heat generated by high-density ESD current, the ESD design rule often allows relatively large spacing between the gate regions and drain contacts as shown in FIGS. 7(A) and (B) and 8(A), (B), and (C). In another example, the spacing is equal to or longer than 1.72 µm. Accordingly, the polysilicon regions 740 can be inserted to the drain regions of the protection transistors in order to increase lengths of the current paths and raise the drain resistance without violating the ESD design rule. Certain embodiments of the present invention provide junction doping profiles between LDD regions and pocket implant regions related to floating and/or biased polysilicon regions, which is steeper than junction doping profiles between LDD regions and pocket implant regions for protection transistors. Some embodiments of the present invention significantly lower junction breakdown voltage of secondary transistors until the primary ESD transistors are fully functional to protect the input pin. For example, the transistors 1210 and 1220 are primary ESD transistors, and the transistors 1230 and 1240 are secondary transistors. In another example, the secondary transistors with lowered junction breakdown voltage can effectively limit the voltage or current of the protected system until the primary ESD transistors are fully operational for protection. Some embodiments of the present invention use certain protection transistors that are the same as the protected transistors, such as the core transistors.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A system for electrostatic discharge protection, the system comprising:
a first transistor including a first drain;
a second transistor including a second drain;
a resistor including a first terminal and a second terminal, the first terminal being coupled to the first drain and the second drain;
a third transistor coupled to the second terminal and a protected system, the third transistor including a first gate, a first dielectric layer located between the first gate and a first substrate, a first source, and a third drain, the protected system including a fourth transistor, the fourth transistor including a second gate, a second dielectric layer located between the second gate and a second substrate, a second source, and a fourth drain;
wherein:
the third transistor is selected from a plurality of transistors, the plurality of transistors including a plurality of gate regions, a plurality of source regions, and a plurality of drain regions;
each of the plurality of gate regions intersects a polysilicon region, the polysilicon region being separated from the first substrate by a third dielectric layer;
at least a part of the polysilicon region is located on an active area within the first substrate.

2. The system of claim 1 wherein the plurality of source regions and the plurality of drain regions are located within the active area in the first substrate, the active area being adjacent to at least an isolation region in the first substrate.

3. The system of claim 1 wherein:
the second dielectric layer and the third dielectric layer are associated with the same composition and the same thickness;
the second gate and the polysilicon region are associated with the same composition and the same thickness.

4. The system of claim 1 wherein:
the polysilicon region is adjacent to a first doped region and a second doped region, the first doped region and the second doped region being associated with opposite charge polarities;
the second drain includes a third doped region and a fourth doped region, the third doped region and the fourth doped region being associated with opposite charge polarities.

5. The system of claim 4 wherein:
the first doped region and the third doped region are associated with the same doping profile;
the second doped region and the fourth doped region are associated with the same doping profile.

6. The system of claim 1 further comprising two or more polysilicon regions, the two or more polysilicon regions being separated from the first substrate by a plurality of dielectric layers.

7. The system of claim 6 wherein:
the two or more polysilicon regions are on one of the plurality of drain regions or one of the plurality of source regions;
the two or more polysilicon regions are not in direct contact with each other;
each of the two or more polysilicon regions is not in direct contact with anyone of the plurality of gate regions.

8. The system of claim 1 wherein, in a top view, the polysilicon region is at least partially located within the active area and surrounds the plurality of source regions and the plurality of drain regions, the top view being directed to a surface of the first substrate, the third dielectric layer being on the surface of the first substrate.

9. The system of claim 1 wherein the first substrate and the second substrate are the same substrate.

10. The system of claim 1 wherein:
the first dielectric layer and the second dielectric layer are associated with the same composition and the same thickness;
the first gate and the polysilicon region are associated with the same composition and the same thickness.

* * * * *